(12) United States Patent
Onda et al.

(10) Patent No.: US 7,230,300 B2
(45) Date of Patent: Jun. 12, 2007

(54) SEMICONDUCTOR DEVICE WITH PERIPHERAL TRENCH

(75) Inventors: Masahito Onda, Gunma (JP); Hirotoshi Kubo, Gunma (JP); Shouji Miyahara, Gunma (JP); Hiroyasu Ishida, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 79 days.

(21) Appl. No.: 10/929,727

(22) Filed: Aug. 31, 2004

(65) Prior Publication Data

US 2005/0073004 A1  Apr. 7, 2005

(30) Foreign Application Priority Data

Sep. 25, 2003  (JP) .............................. 2003-333889

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. ...................... 257/341; 257/301; 257/302; 257/303; 257/304; 257/305; 257/328; 257/329; 257/330; 257/331; 257/332; 257/333; 257/334; 257/401; 257/908

(58) Field of Classification Search ........ 257/328–334, 257/301–305, 341, 401, 908
See application file for complete search history.

(56) References Cited

U.S. PATENT DOCUMENTS

| | | | | |
|---|---|---|---|---|
| 4,969,020 A | | 11/1990 | Matsushita et al. | |
| 5,293,055 A | * | 3/1994 | Hara et al. | 257/296 |
| 5,309,008 A | * | 5/1994 | Watanabe | 257/304 |
| 6,249,017 B1 | * | 6/2001 | Togo | 257/301 |
| 6,262,453 B1 | * | 7/2001 | Hshieh | 257/341 |
| 6,617,641 B2 | * | 9/2003 | Nakagawa et al. | 257/330 |
| 6,621,107 B2 | * | 9/2003 | Blanchard et al. | 257/155 |
| 6,713,352 B2 | * | 3/2004 | Hshieh et al. | 438/270 |
| 6,784,486 B2 | * | 8/2004 | Baliga | 257/327 |
| 6,878,989 B2 | * | 4/2005 | Izumisawa et al. | 257/328 |
| 2003/0042537 A1 | * | 3/2003 | Nakamura et al. | 257/328 |
| 2003/0047778 A1 | * | 3/2003 | Nakamura et al. | 257/330 |
| 2004/0016959 A1 | * | 1/2004 | Yamaguchi et al. | 257/327 |
| 2004/0041207 A1 | * | 3/2004 | Takano et al. | 257/330 |
| 2005/0035398 A1 | * | 2/2005 | Williams et al. | 257/329 |
| 2005/0035400 A1 | * | 2/2005 | Shirai et al. | 257/330 |

FOREIGN PATENT DOCUMENTS

JP  09-331071  12/1997

* cited by examiner

*Primary Examiner*—Ida M. Soward
(74) *Attorney, Agent, or Firm*—Morrison & Foerster LLP

(57) ABSTRACT

Conventional power MOSFETs enables prevention of an inversion in a surrounding region surrounding the outer periphery of an element region by a wide annular layer and a wide sealed metal. Since, resultantly, the area of the surrounding region is large, increase in the element region has been restrained. A semiconductor device is hereby provided which has an inversion prevention region containing an MIS (MOS) structure. The width of polysilicon for the inversion prevention region is large enough to prevent an inversion since the area of an oxide film can be increased by the depth of the trench. By this, leakage current can be reduced even though the area of the region surrounding the outer periphery of the element region is not enlarged. In addition, since the element region is enlarged, on-state resistance of the MOSFET can be reduced.

4 Claims, 7 Drawing Sheets

SEMICONDUCTOR DEVICE WITH PERIPHERAL TRENCH

Priority is claimed to Japanese Patent Application Number JP2003-333889 filed on Sep. 25, 2003, the disclosure of which is incorporated herein by reference in its entirety.

BACKGROUND OF THE INVENTION

1. Field of the Invention

The present invention relates to a semiconductor device and a method of manufacturing the semiconductor device, specifically to the semiconductor device and the method thereof intended to improve breakdown voltage and inhibit leakage current by blocking the spread of a depletion layer in a peripheral area.

2. Description of the Related Art

A discrete device includes an element region where impurities are diffused on a semiconductor substrate and where a predetermined element is provided. While the discrete device is operating, a depletion layer expands from the element region (diffusion region) into the semiconductor substrate depending on applied voltage, and hereby secures breakdown voltage. However, an area is needed which prevents a surface of the substrate from inverting in a region surrounding the outer periphery of the element region.

FIG. 8 is a cross-sectional view showing a surrounding region of the conventional semiconductor devices. Here, the element region 51 is defined as a region which includes, for example, a region in which a power MOSFET 52 of a trench type is provided and a region in which a channel layer 34 and a guard ring 33 are provided in the vicinity of the region where the MOSFET 52 is provided. The guard ring 33 is a region which extends downwards deeper than the channel layer 34 and has the same conduction type with the channel layer 34. The guard ring 33 relaxes concentration of electric field which is to occur in an end of the element region 51. In addition, polysilicon 43c is connected to a gate connection electrode 48 in order to apply gate voltage to a gate electrode 43.

Furthermore, in a surrounding region 55 surrounding the outer periphery of the element region, a sealed metal 49 is provided outside the gate connection electrode 48, and an annular layer 50 in which high concentration impurities are diffused on the surface of the substrate underneath the sealed metal 49 is provided in order to prevent inversion of the substrate surface.

A description will be provided for a conventional method of manufacturing semiconductor devices with reference to FIG. 9. With regard to MOSFETs, a drain region 32 formed of an n− type epitaxial layer is formed on an n+ type silicon semiconductor substrate 31, and an n+ type annular layer 50, a p type channel layer 34 and a guard ring 33 are formed on the surface of the drain region 32. Hereafter, a trench 37 is formed which penetrates through the channel layer 34 and reaches the drain region 32 (FIG. 9A). Furthermore, an inner wall of the trench 37 is covered with a gate oxide film 41, and a gate electrode 43 is provided which is made up of polysilicon filled into the trench 37. An n+ type source region 45 is formed on the surface of the channel layer 34 adjacent to the trench 37. A p+ type body region 44 is formed on the surface of the channel layer 34 between the two source regions 45 of two MOSFET cells which are next to each other, and in the outer periphery of the element region (FIG. 9B). The top of the gate electrode 43 is covered with an interlayer insulating film 46, and a source electrode 47 is provided which is in contact with the source region 45 and the body region 44. In this way, the element region 51 is formed where a plurality of MOSFETs (cells) 52 are arrayed. In addition, while the source electrode 47 is formed, the gate connection electrode 48 and the sealed metal 49 are formed (FIG. 9C).

The annular layer 50 in the surrounding region 55 is a wide diffusion region, and is formed by diffusing the high concentration impurities in a phosphorous glass diffusion process while masking in a way that only the a part of the annular layer 50 is exposed before forming the guard ring 33 and the channel region 34 (Refer to FIG. 9). A typical example of such a semiconductor device can be found in Japanese Laid-Open Patent Application No. Hei 9-331071.

SUMMARY OF THE INVENTION

The preferred embodiments of the present invention were accomplished in light of the foregoing problems and provide a semiconductor device comprising: an element region provided by diffusing prescribed impurities on a semiconductor substrate; a surrounding region surrounding the outer periphery of the element region; a trench provided on the semiconductor substrate in the surrounding region; an insulating film formed in the trench; and a conductive material buried in the trench, wherein the same electric potential which is applied to the substrate is applied to the conductive material.

The preferred embodiments of the present invention also provide a semiconductor device comprising an element region in which an insulating gate semiconductor element of a trench type is provided on a semiconductor substrate; a surrounding region surrounding the outer periphery of the element region; a trench provided in the area periphery of the element region on the semiconductor substrate; an insulating film formed in the trench; and a conductive material buried in the trench, wherein the same electric potential which is applied to the substrate is applied to the conductive material.

Furthermore, the conductive material of the semiconductor device is polysilicon.

Moreover, in the semiconductor device, a high concentration impurity region which is in contact with the conductive material is provided on the surface of the substrate in the surrounding region surrounding the outer periphery of the element region.

The preferred embodiments of the present invention provide the following method of manufacturing a semiconductor device which includes an element region where a prescribed element is formed and a surrounding region surrounding the outer periphery of the element region. The manufacturing method comprises: a step of forming a trench in the surrounding region; a step of forming an insulating film on the inner wall of the trench; a step of burying a conductive material in the trench; and a step of electrically connecting the conductive material which has been buried in the trench and the substrate.

The preferred embodiments of the present invention provide another method of manufacturing a semiconductor device which includes an element region where an element of a trench type is formed and a surrounding region surrounding the outer periphery of the element region on the semiconductor substrate. The manufacturing method comprises: a step of forming a first trench in the surrounding region, and of forming a second trench in the element region; a step of forming insulating films on the inner walls of the first trench and the second trench; a step of burying conductive materials in the first trench and the second trench; a step of forming an element region by diffusing prescribed impurities in an area surrounding the second trench; and a step of electrically connecting the conductive material which has been buried in the first trench and the substrate, and of forming a prescribed electrode which is in contact with the element region.

In addition, the method of manufacturing the semiconductor device includes that a high concentration impurity region is formed on the surface of the substrate in the surrounding region in a step of forming the element region.

Moreover, the method of manufacturing the semiconductor device includes that the high concentration impurity region is formed by an ion implantation process.

The preferred embodiments of the present invention have the following effects. An inversion prevention region, which contains an MIS (MOS) structure, is provided in the surrounding region surrounding the outer periphery of an element region. This prevents a surrounding region from inverting, and consequently reduces leakage current. By applying drain voltage by use of a trench-type MIS (MOS) structure, the surface of the substrate in the surrounding region is prevented from inverting. For this reason, neither a wide annular layer nor a sealed metal need to be provided unlike conventional structures. An oxide film of the inversion prevention region is the same oxide film as is used for a gate oxide film of the element region, and is so extremely thin that a strong electric charge can be generated around the trench.

In addition, since the MIS (MOS) structure has the trench type, this increases the area of the oxide film. Thus, the inversion can be sufficiently prevented by the trench with a small width. According to conventional structures, an annular layer has been formed, at a sufficient distance away from a guard ring for the purpose of securing breakdown voltage, and additionally by diffusing impurities sufficiently in the horizontal direction by a phosphorous glass diffusion process for the purpose of preventing an inversion. This has prevented the area of the surrounding region from being reduced. According to the present embodiments, however, it is sufficient that an area in which the annular layer has been formed have only a width which is equal to that of the inversion prevention region that contains the MIS structure (i.e. a width of the polysilicon). Consequently, the area of the surrounding region can be reduced to a large extent.

The element region can be include other discrete devices such as a bipolar transistor, a diode and a Schottky barrier diode. Elements of these kinds could contribute to enlarging the element region and reducing the area of the chip.

Furthermore, if an insulating gate semiconductor element is used, this enables the inversion prevention region and the element region to be formed in the same manufacturing step. Moreover, a high concentration impurity region is formed for the purpose of further improving an effect of preventing an inversion through enhancing properties of an ohmic contact with the sealed metal. The high concentration impurity region can be formed at the same time when a source region of a MOSFET is formed by the same ion implantation process.

In other words, the present invention brings an advantage that the inversion prevention region can be formed without any need of a large area so that the area of the surrounding region can be reduced, and thus without increasing the number of manufacturing steps.

DESCRIPTION OF THE PREFERRED EMBODIMENT

A detailed description will be provided for an embodiment of the present invention citing a case that a trench type of an n channel MOSFET is formed in an element region.

Figure 1A:
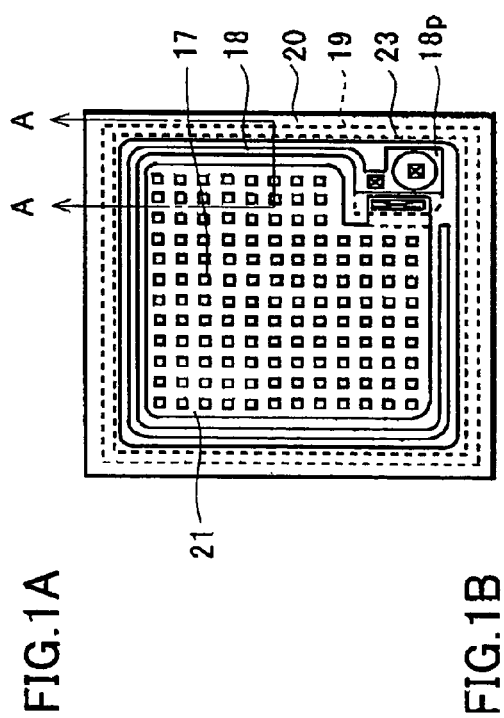
FIG. 1A is a plan view and FIG. 1B is a cross-sectional view of a semiconductor device according to some preferred embodiments.
Figure 1B:
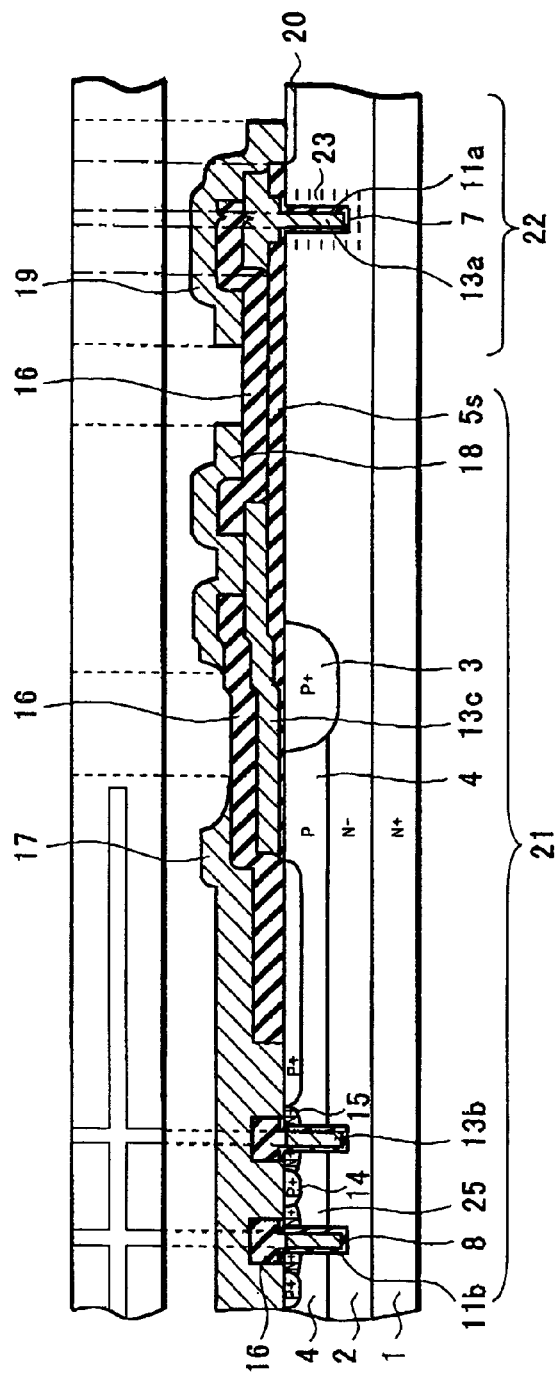

FIG. 1 shows a constitution of a semiconductor device according to a preferred embodiment of the present invention. FIG. 1A is a plan view of the chip, and FIG. 1B is a cross-sectional view taken in the A-A line. Additionally, a schematic above FIG. 1B is a plan view of a portion corresponding to the portion shown in FIG. 1B.

A number of MOSFETs 25 are arrayed in an element region 21. A source electrode 17 is formed in a way that the source electrode 17 is connected with a source region in each of the MOSFETs 25 in the element region 21. A gate connection electrode 18 is connected with a gate electrode 13b, and is provided in the periphery of the element region 21. The gate connection electrode 18 is connected with a gate pad electrode 18p.

As shown in the cross-sectional view of FIG. 1B, the MOSFET 25 is formed in a p type channel layer 4 formed on an n− type epitaxial layer 2 to be a drain region that is constructed on an n+ type silicon semiconductor substrate 1 (A detailed description will be provided later). In an end of the channel layer 4, a guard ring 3 which is a p+ type region with high concentration is formed in a way that the depth of the guard ring 3 is larger than that of the channel layer 4, and accordingly the guard ring 3 relaxes a curvature of a depletion layer in an end of the channel layer 4 so that concentration of electric field is inhibited.

The gate electrode 13b of the MOSFET 25 is extended in the periphery of the element region 21, as shown by 13c. In addition, the gate electrode 13b is connected with the gate connection electrode 18. The gate connection electrode 18 is connected with the gate pad electrode 18p, and applies a gate voltage to the MOSFET 25.

In this embodiment, a region ranging from an area in which the MOSFET 25 is provided to the gate connection electrode 18 is defined as the element region 21, and an area outside the gate connection electrode 18 and which is surrounding the outer periphery of the element region 21 is denominated as a surrounding region 22. A first trench 7 is formed in the surrounding region 22, and the inner wall of the first trench 7 is covered with an oxide film 11a. The first trench 7 is formed so as to be deeper than, for example, the channel layer 4 of the element region 21, and the oxide film 11a inside the first trench 7 is a thin film with a thickness ranging from 300 Å to 700 Å approximately. Polysilicon 13a which has been doped with impurities is buried inside the first trench 7. The polysilicon 13a is patterned in a way that the polysilicon 13a remains on the surface of the substrate around the first trench 7. The first trench 7 is formed away from the guard ring 3 by a distance, which is equal to, or longer than, the depth of the drain region 2 and thus breakdown voltage is secured.

As shown in FIG. 1B, a sealed metal 19 is formed on the top of polysilicon 13a which protrudes from the surface of the substrate 1, in a way that the sealed metal 19 is insulated from the gate connection electrode 18. The sealed metal 19 is in contact with a high concentration impurity region 20 which is formed on the outer periphery of the first trench 7. Additionally, substrate (drain) voltage is applied to the sealed metal 19.

Figure 2:
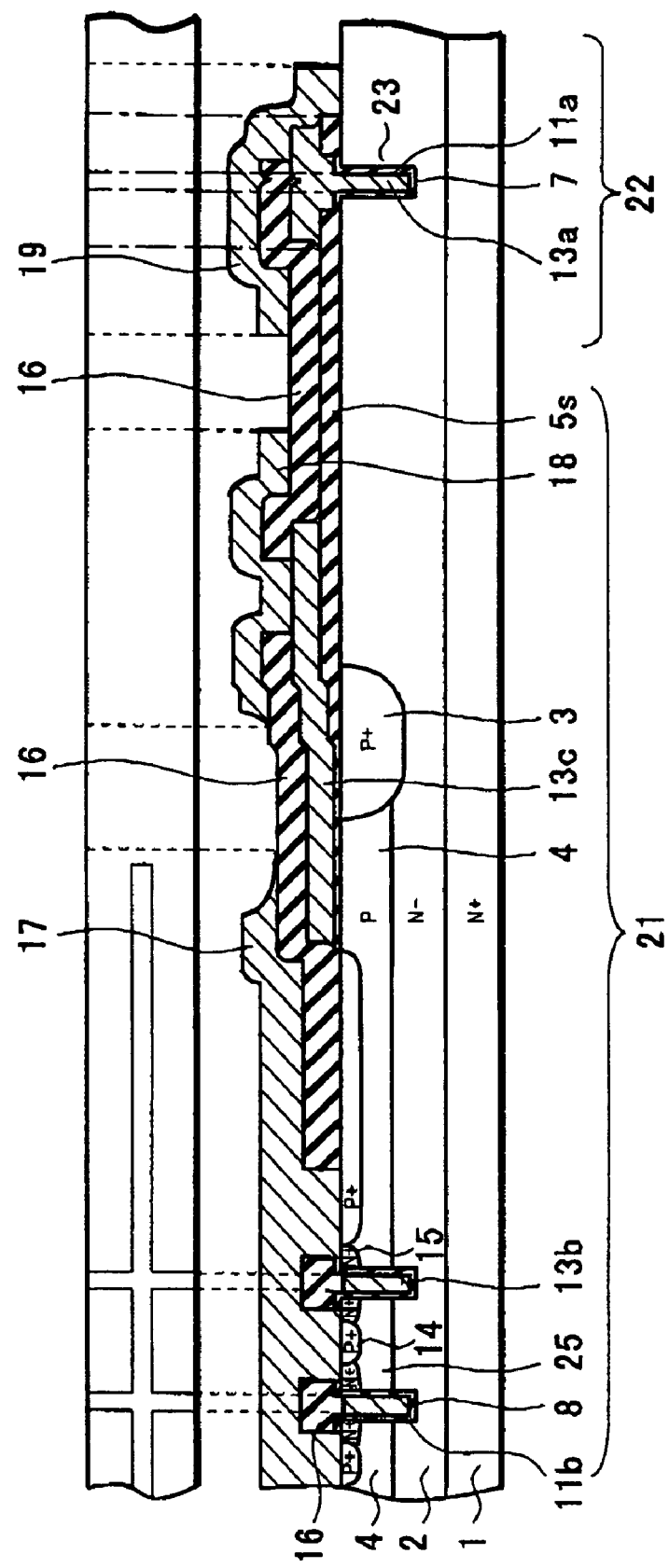
FIG. 2 is a cross-sectional view of the semiconductor device according to some preferred embodiments.

The polysilicon 13a is isolated from the epitaxial layer 2 with the oxide film 11a placed in-between, and constitutes a MIS (Metal Insulator Semiconductor) structure or a MOS (Metal Oxide Semiconductor) structure by applying a drain voltage to the polysilicon 13a. By this, the semiconductor device according to this embodiment prevents an inversion in the surrounding region 22, and hereinafter a region in which MOS structure is formed is referred to as an inversion prevention region 23. Incidentally, the high concentration impurity region 20 causes properties of an ohmic contact between the sealed metal 19 to be improved, and can further prevent inversion of the substrate conductivity type outside the inversion prevention region 23. If the absence of the high concentration impurity region 20 does not affect properties of preventing an inversion, the high concentration impurity region 20 need not be provided as shown in FIG. 2. Accordingly, the area of the surrounding region 22 can be reduced. In addition, if similarly the absence of the guard ring 3 does not affect properties of breakdown voltage, the guard ring 3 need not be provided.

Next, a description will be provided for the MOSFET which consists of the element region 21 with reference to FIG. 1B. As shown in the figure, the MOSFET 25 comprises the semiconductor substrates 1 and 2, the channel layer 4, a second trench 8, a gate insulating film 11b, the gate electrode 13b, a source region 15 and a body region 14. Here, this embodiment will be described citing an example of an n channel type MOSFET.

The semiconductor substrate is constructed by laminating the n− type epitaxial layer to be the drain region 2 on the n+ type silicon semiconductor substrate 1. The channel layer 4 is a diffusion region formed by implanting p type boron or the like into the surface of the drain region 2 in a selective manner.

The second trench 8 is formed in a way that the second trench 8 penetrates through the channel layer 4 and reaches the drain region 2. Generally, patterning of the second trench 8 is formed onto the semiconductor substrate in a latticed or striped form. The oxide film 11b is formed on the inner wall of the second trench 8, and polysilicon is buried therein in order to form the gate electrode 13b.

The gate oxide film 11b is formed corresponding to the operating voltage in a thickness of several hundred angstroms at least on the inner wall of the second trench 8 which is in contact with the channel layer 4. Since the gate oxide film 11b is an insulating film, the gate oxide film 11b is put in-between the gate electrode 13b formed in the second trench 8 and the semiconductor substrate, to form the MOSFET structure.

The gate electrode 13b is formed by burying a conductive material in the second trench 8. The conductive material is, for example, polysilicon. n type impurities are doped into the polysilicon for the purpose of decreasing resistance. This gate electrode 13b is extracted out onto the substrate as shown by 13C, and is extended in the gate connection electrode (indicated with reference to 18 in FIG. 1B). The gate electrode 13b is connected with the gate pad electrode (indicated with reference to 18p in FIG. 1B) which is formed in the semiconductor substrate. A material for the gate electrode 13b is not limited to polysilicon into which impurities are doped. Metal or the like may be used for the gate electrode 13b, if it is a conductive material.

The source region 15 is a diffusion region formed by implanting n+ type impurities on the surface of the channel layer 4 adjacent to the second trench 8, and is in contact with the source electrode 17 formed of a metal which covers the element region 21. In addition, the body region 14 which is a region where p+ type impurities are diffused is provided on the surface of the channel layer 4 between the adjacent source regions 15 and on the surface of the channel layer 4 in the outer periphery of the element region 21, and hereby electric potential of the substrate is stabilized. By this, a portion surrounded by adjacent second trenches 8 constitutes a unit element (cell) of the MOSFET 25, and an aggregation of a large number of unit elements composes the element region 21.

The source electrode 17 is a metal electrode in which patterning is formed in a desired shape after sputtering aluminium or the like through an interlayer insulating film 16. The source electrode 17 covers the element region 21, and is in contact with the source region 15 and the body region 14.

Figure 8:
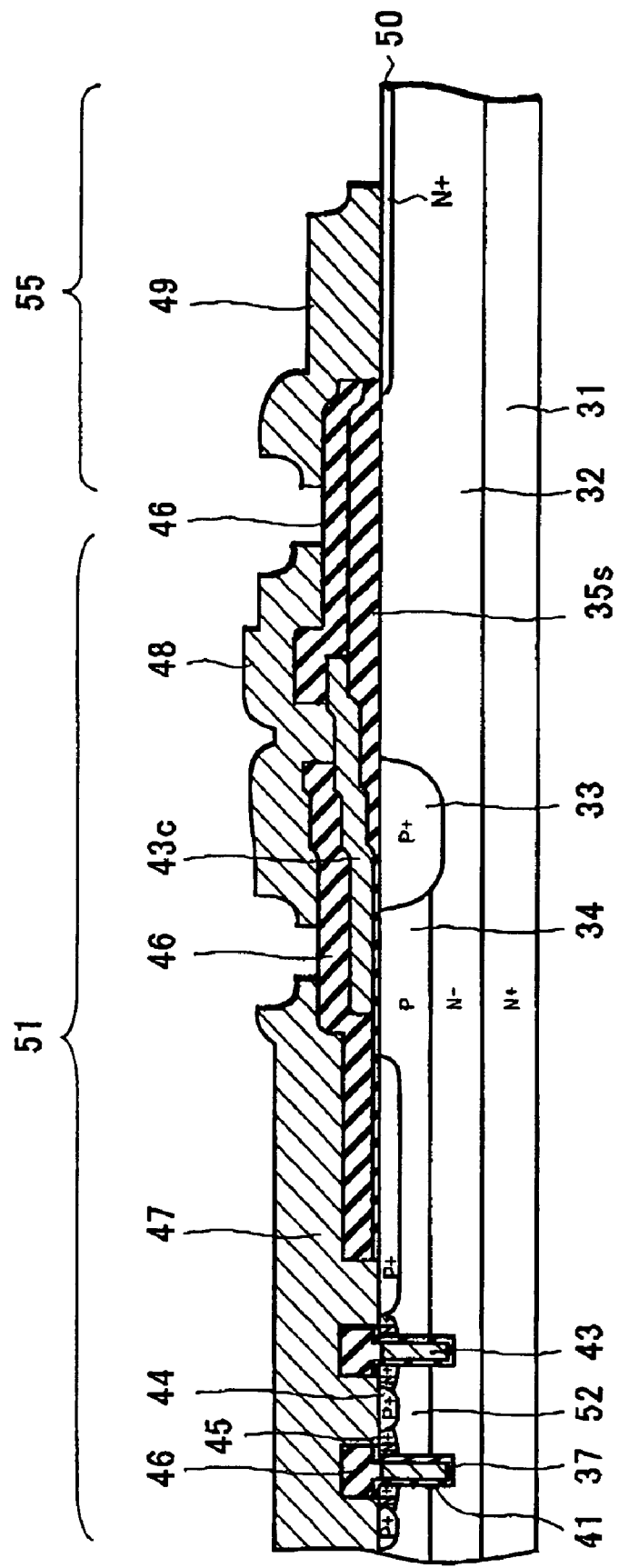
FIG. 8 is a cross-sectional view of a conventional semiconductor device.
Figure 9A:
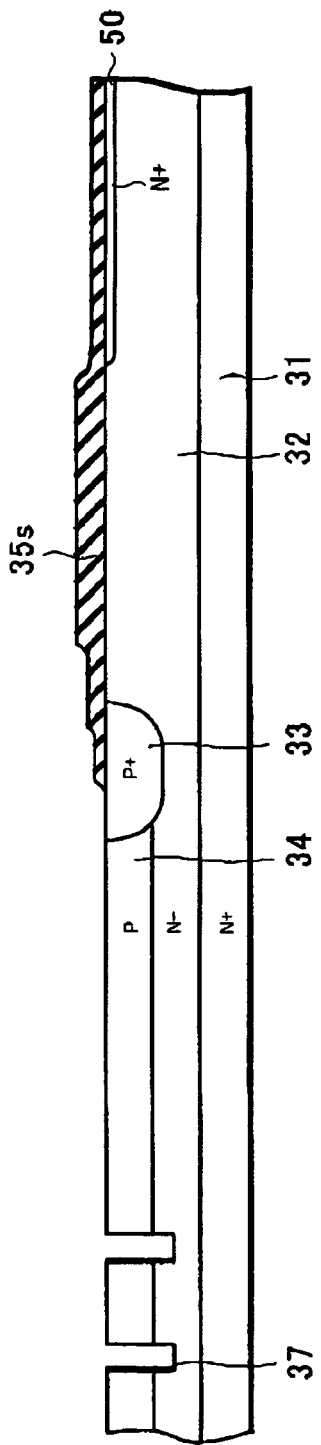
FIG. 9 is a cross-sectional view of a method for manufacturing the conventional semiconductor device.
Figure 9B:
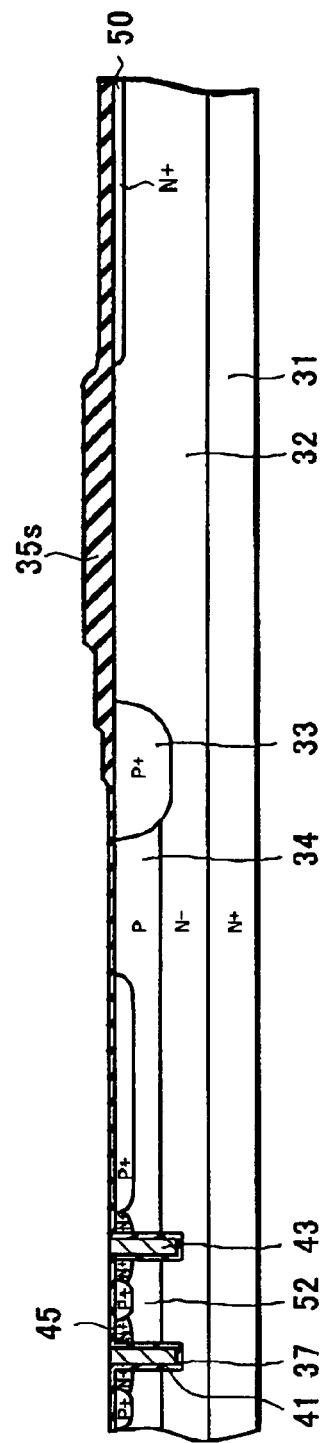
Figure 9C:
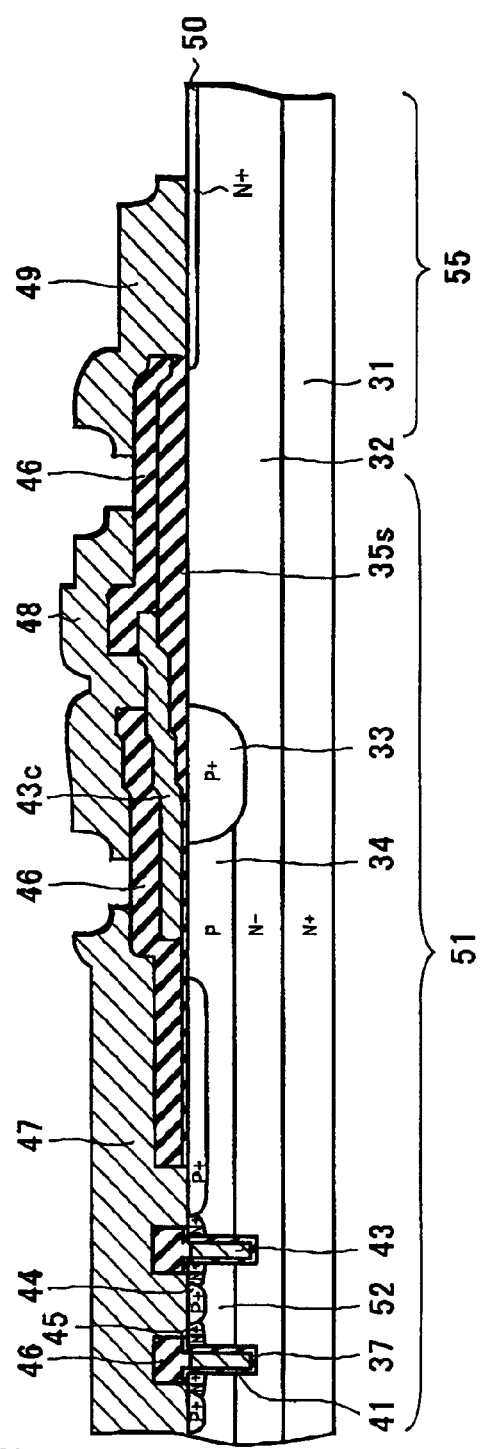

With regard to discrete devices including the MOSFET, as shown in FIG. 8, the annular layer 50 is formed where impurities are diffused in high concentration in the surrounding region 55, and this prevents the conductivity type of the surface of the substrate from inverting. While applying, for example, VDSS breakdown voltage (reverse bias breakdown voltage between the drain and the source while the gate and the source are short-circuited), the gate connection electrode 48 causes the conductivity type of the surface of the substrate underneath the gate connection electrode 48 to invert. Accordingly, the inverted area thus caused extends into the guard ring 33. In this point, the sealed metal 49 is easy to be put into a condition which is approximate to a floating condition, and the surface of the substrate underneath the sealed metal 49 is also easy to invert under an influence of an extrinsic electric charge such as molded resin which is a packaging material. In other words, the inversion creates problems that the inverted area extends from the guard ring 33 throughout the end of the chip and that the inversion accordingly causes IDSS current to leak. Against this background, the annular layer 50 in which the high concentration impurities are diffused on the surface of the substrate underneath the sealed metal 49 is provided so that the inversion should not reach the end of the chip.

In this point the annular layer 50 is provided at a sufficient distance away from the guard ring 33 with an expansion of the depletion layer taken into consideration. The depletion layer expands in the horizontal and vertical directions relative to the surface of the substrate while reverse bias. Incidentally, breakdown voltage is determined by a distance that the depletion layer reaches to the n+ type substrate that is located underneath the bottom of the drain region 32. With this taken into consideration, the annular layer 50 is provided away from the guard ring 33 by a distance which is equal to, or larger than, the depth of the drain region 32, for the purpose of preventing the breakdown voltage from being deteriorated. In addition, the conventional annular layer 50 and sealed metal 49 are more effective at preventing an inversion if the annular layer 50 and sealed metal 49 are formed wider. For this reason, the annular layer 50 is formed by a phosphorous glass diffusion process for the purpose of diffusing impurities sufficiently widely in the horizontal direction.

If, however, the widths of the annular layer 50 and the sealed metal 49 are made too large, this enlarges the surrounding region 55 surrounding the outer periphery of the element region 51, and consequently this enlarges the dimensions of the chip. On the other hand, if the dimensions of the chip are inhibited from being enlarged, this makes the element region 51 small, and consequently this prevents on-state resistance from being reduced, for example, with regard to MOSFETs. In addition, MOSFETs employ no phosphorus glass diffusion process for forming elements thereof. For this reason, the annular layer 50 has to be formed in a manufacturing step that is separate from a manufacturing step for forming the element region 51. This has been a problem of making manufacturing steps complicated.

According to this embodiment, as described above, the inversion prevention region 23 which contains the MIS structure or the MOS structure is provided in the surrounding region 22, and drain voltage is applied to the inversion prevention region 23. In addition, as described later, the inversion prevention region 23 is formed in the same manufacturing step where the MOSFET in the element region 21 is formed. In other words, the polysilicon 13a and the oxide film 11a of the inversion prevention region 23 are formed of the same material as the gate electrode 13b and the gate oxide film 11b of the MOSFET 25 are formed.

In other words, the oxide film 11a of the inversion prevention region 23 is as extremely thin as the gate oxide film 11b. According to a conventional structure, a CVD oxide film (see FIG. 8), which has the same thickness as the interlayer insulating film has, is formed outside the guard ring 33, and this portion outside the guard ring 33 contains a MOS structure. However, the oxide film is very thick, and is, for example, 6,000 Å to 8,000 Å in thickness. Consequently, the prevention of the inversion by this oxide film is less effective, and therefore the annular layer 50 is needed. By contrast, according to this embodiment, since the oxide film 11a is sufficiently thin, capacitance corresponding to the oxide film becomes large. If applied voltage is constant, very strong electric charges (negative charges in this case) accumulate around the inversion prevention region 23 (See FIG. 1B).

With this taken into consideration, in this embodiment, the oxide film 11a between the sealed metal 19 and the epitaxial layer 2 is sufficiently thin, and hereby causes strong electric charges to be distributed around the oxide film 11a. Accordingly, this embodiment intends to prevent the conductivity type of the surface of the substrate from inverting in the surrounding region 22. Here, the larger area the thin oxide film 11a has, the more effectively the conductivity type of the surface of the substrate is prevented from inverting, as in the case of the annular layer 50. For this reason, the inversion prevention region 23 is formed to contain the trench, and the area of the thin oxide film 11a increases by the depth of the trench. This improves the effect of preventing an inversion, and enables the annular layer to be eliminated.

In other words, the structure according to this embodiment can decrease the area of the surrounding region 22 to a large extent, and can suppress IDSS leakage current, in comparison with conventional structures. Since the area of the surrounding region 22 can be decreased, the dimensions of the chip can be secured. As long as the dimensions of the chip according to this embodiment are equal to those of conventional chips, the area of the element region 21 can be enlarged accordingly, and hereby this can also contribute to reducing on-state resistance. Incidentally, since the inversion prevention region 23 is provided away from the guard ring 3 by a distance which is equal to, or longer than, at least the depth of the drain region 2, breakdown voltage can be secured as in the case of conventional structures.

The polysilicon 13a of the inversion prevention region 23 may be replaced with conductive materials such as metals. In addition, a conductive material for the MOSFET 25 may be different from a conductive material for the inversion prevention region 23 if the MOSFET 25 and the inversion prevention region 23 are formed in respective different manufacturing steps, although the MOSFET 25 and the inversion prevention region 23 may be formed of the same conductive material if the MOSFET 25 and the inversion prevention region 23 are formed in the same manufacturing step.

The oxide film 11a may be replaced with another insulating film. In this case, however, it is preferable that the insulating film is formed as thin as possible in order to generate strong electric field.

It should be noted that the formation of the element region 21 is not limited to the MOSFET 25. The formation of the element region 21 can be realized by use of what is called a discrete device in the same manner. If an element is particularly an insulating gate element of a trench type like an IGBT, the element is preferable since, as described later, the inversion prevention region 23 can be formed in the same manufacturing step as the element region 21 is formed.

If the discrete device is formed to include a plurality of elements in a single chip (e.g. a MOSFET and a Schottky barrier diode), each of the elements can be separated by the inversion prevention region 23.

Next, a method for manufacturing the semiconductor device according to the present invention will be shown in FIG. 3 to FIG. 7, citing an example of an n channel type MOSFET.

The method of manufacturing a semiconductor device according to the present invention, which includes an element region where a prescribed element is formed and a surrounding region which is surrounding the outer periphery of the element region, comprising: a step of forming a first trench in the surrounding region, and of forming a second trench in the element region; a step of forming insulating films on the inner walls of the first trench and the second trench; a step of burying conductive materials in the first trench and the second trench; a step of forming an element region by diffusing prescribed impurities in an area surrounding the second trench; and a step of electrically connecting the conductive material which has been buried in the first trench and the substrate, and of forming a prescribed electrode which is in contact with the element region.

The first step (FIG. 3): a step of forming the first trench in the surrounding region, and of forming the second trench in the element region.

Figure 3A:
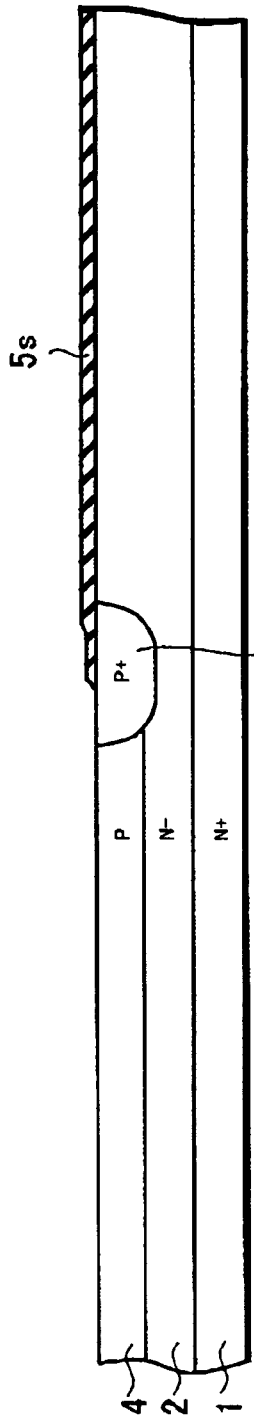
FIG. 3 is a cross-sectional view of a method for manufacturing the semiconductor device according to some preferred embodiments.

A drain region 2 is formed by an n– type epitaxial layer on an n+ type silicon semiconductor substrate 1. In an end of a region to be a channel layer 4, a guard ring 3 is formed by implanting and diffusing boron in high concentration. On the surface, a thermal oxide film 5s is formed. Hereafter, a prescribed portion of the oxide film in the channel layer 4 is etched. Boron is implanted on the entire surface, for example, in a dose of $1.0 \times 10^{13}$ cm$^{-2}$, and hereafter the p type channel layer 4 is formed by diffusing the boron (FIG. 3A). The guard ring 3 is intended to relax concentration of electric field in the end of the channel layer 4. For this reason, the guard ring 3 does not have to be provided as long as the absence of the guard ring 3 does not affect the properties.

Figure 3B:
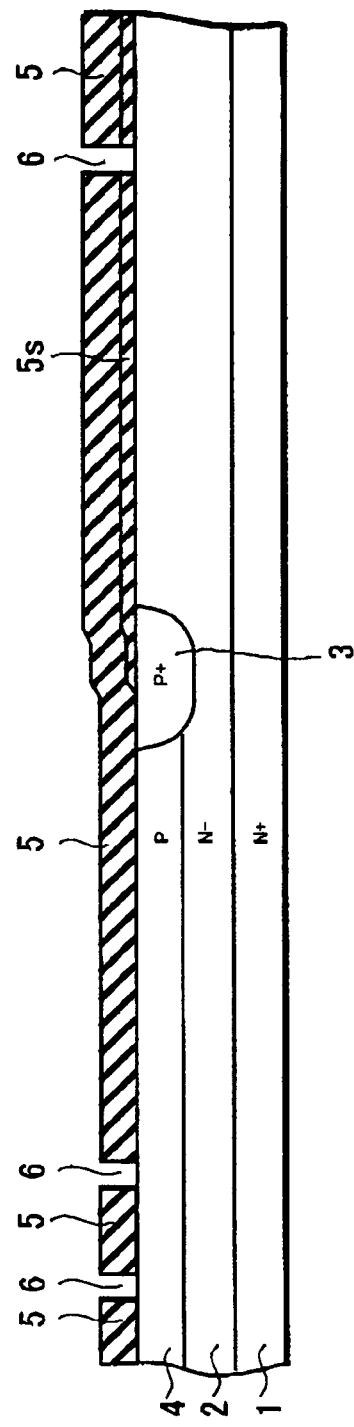

A CVD oxide film 5 made up of NSG (Non-doped Silicate Glass) is formed on the entire surface by a CVD process. Then, the entire surface is masked with a photoresist film, except for the openings of the first trench and the second trench. The CVD oxide film 5 is formed in a way that the CVD oxide film 5 also covers the thermal oxide film 5s. The CVD oxide film 5 is partially removed by dry etching, and hereby an opening of the trench 6 is formed in a way that portions of the channel region 4 are exposed through the opening of the trench 6 (FIG. 3B).

Figure 3C:
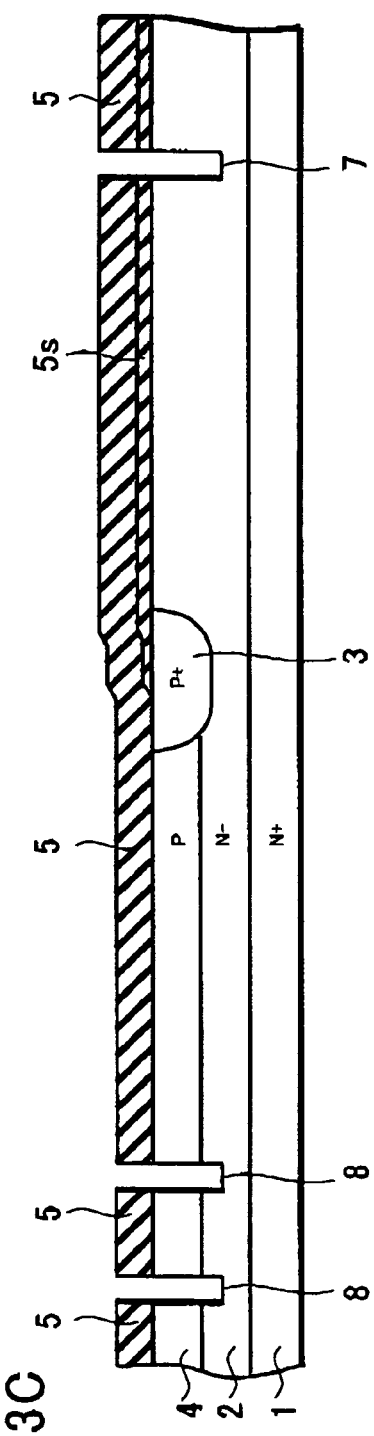
Figure 4:
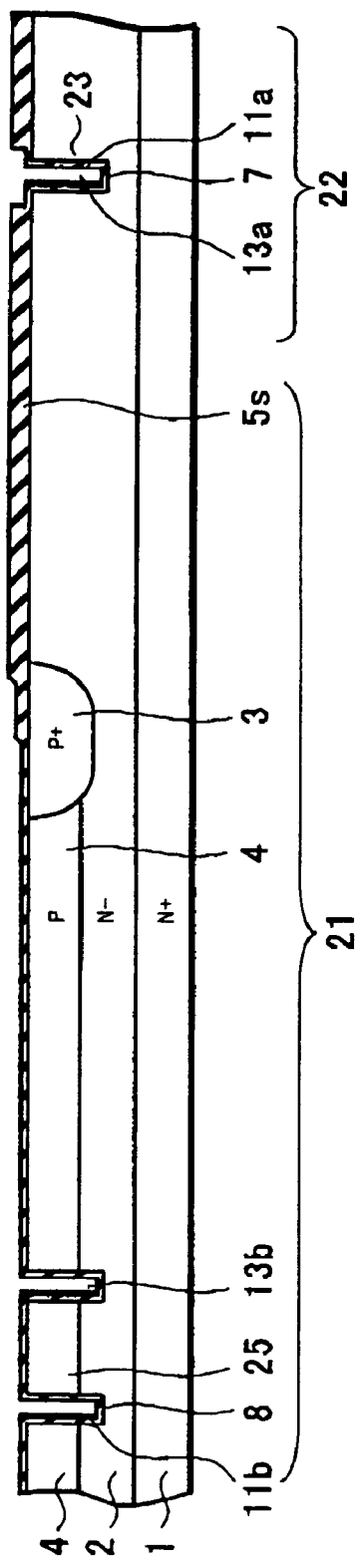
FIG. 4 is a cross-sectional view of a method for manufacturing the semiconductor device according to some preferred embodiments.
Figure 5:
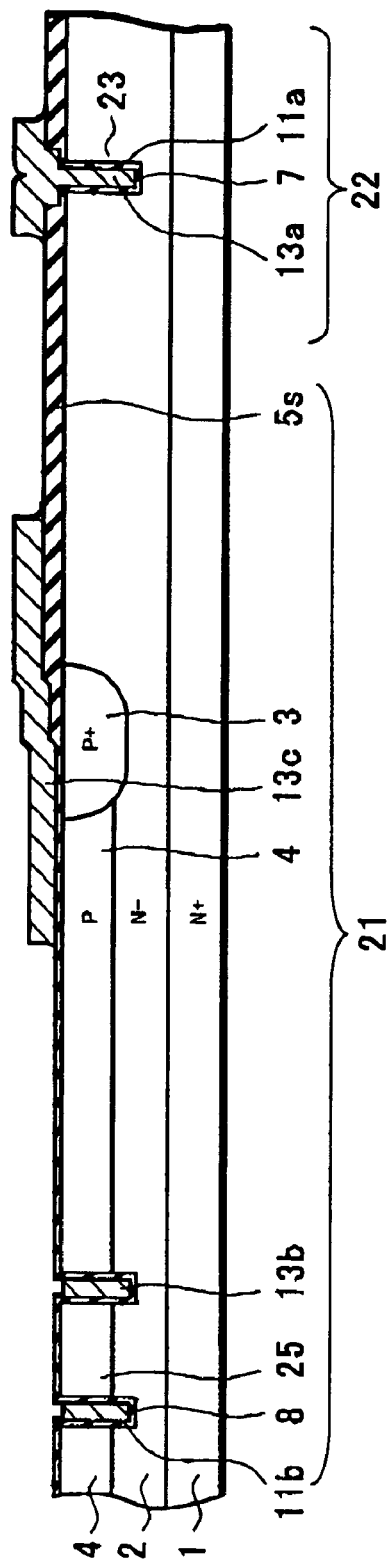
FIG. 5 is a cross-sectional view of a method for manufacturing the semiconductor device according to some preferred embodiments.
Figure 6:
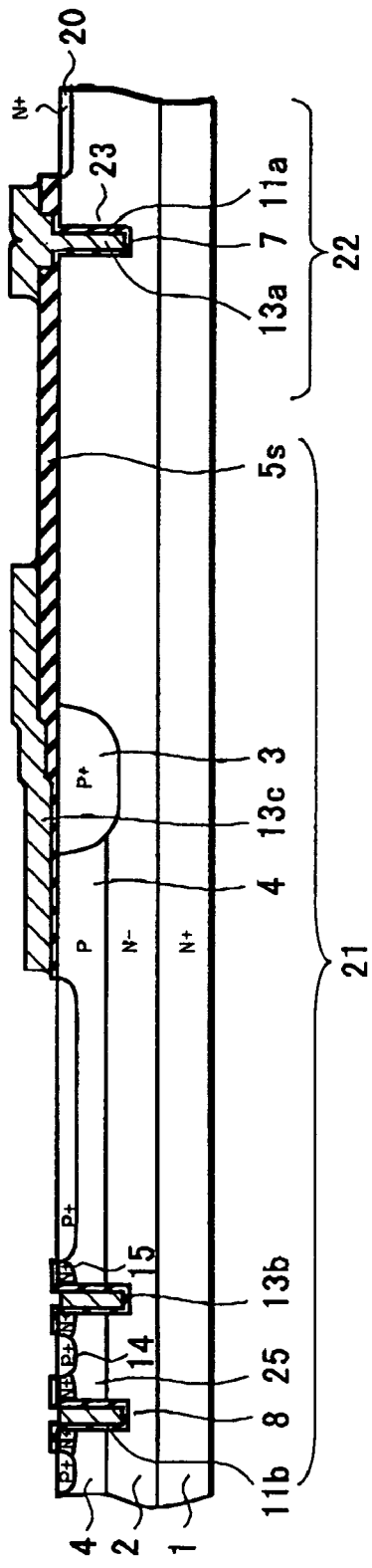
FIG. 6 is a cross-sectional view of a method for manufacturing the semiconductor device according to some preferred embodiments.
Figure 7:
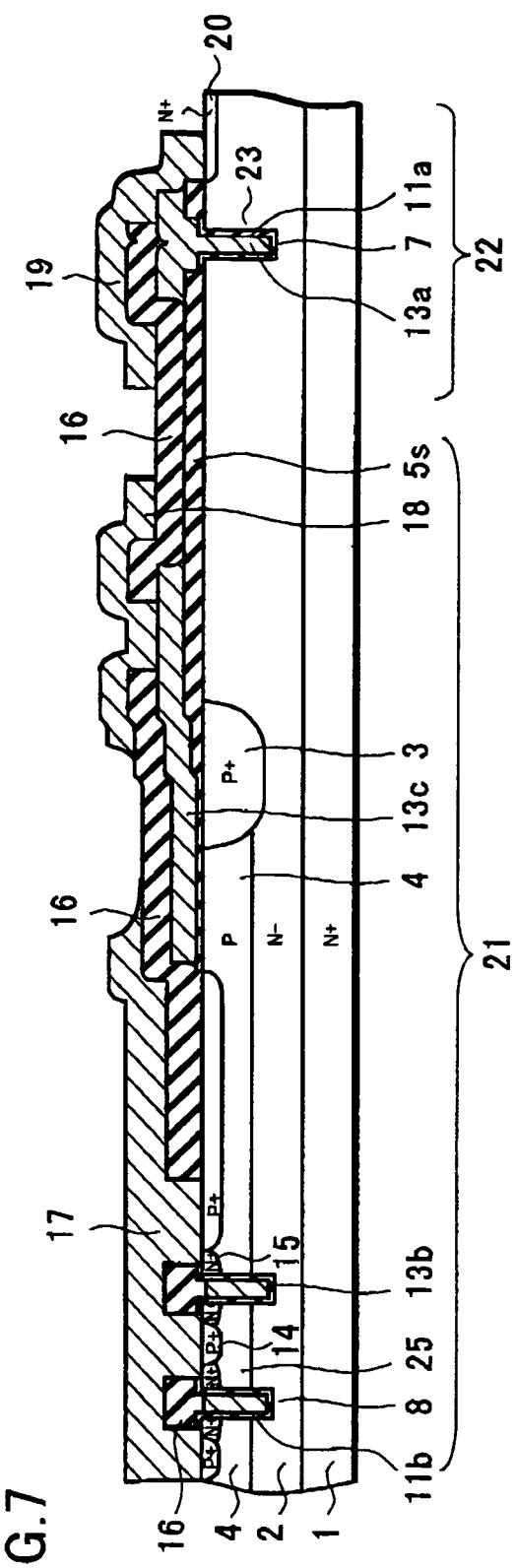
FIG. 7 is a cross-sectional view of a method for manufacturing the semiconductor device according to some preferred embodiments.

Hereafter, the first trench 7 and the second trench 8 are formed, in a way that the first trench 7 and the second trench 8 penetrate through the channel layer 4 and reach the drain region 2, through treating portions of the silicon semiconductor substrate corresponding to the opening of the trench 6 by dry etching with a CF group gas and an HBr group gas while the CVD oxide film 5 is used as the mask (FIG. 3C).

The first trench 7 is provided in the surrounding region 22, and the first trench 7 constitutes an inversion prevention region. In addition, the second trench 8 constitutes an MOSFET in the element region 21, and a plurality of MOSFETs are provided in the element region 21. The first trench 7 and the second trench 8 are formed in the same manufacturing step.

Incidentally, the first trench 7 is formed at a sufficient distance away from the guard ring 3 for the purpose of securing breakdown voltage by causing a depletion layer to expand during a reverse bias. Specifically, the first trench 7 is formed away from the guard ring 3 by a distance which is equal to, or longer than, at least the distance of the drain region 2 in the direction of its depth.

The second step (FIG. 4): a step of forming insulating films on the inner walls of the first trench and the second trench.

An oxide film (not illustrated) is formed on the inner walls of the first trench 7 and the second trench 8 as well as the surface of the channel layer 4 by a dummy oxidation process. By this, damage which has been caused by dry etching is relieved. Hereafter, this oxide film and the CVD oxide film 5 are removed by an etching process.

In addition, a gate oxide film 11b is formed on the inner wall of the second trench 8, for example, with a thickness ranging of 300 Å to 700 Å approximately corresponding to the operating voltage, by oxidizing the entire surface. In this point, the oxide film 11a is also formed on the inner wall of the first trench 7 at the same time. Incidentally, the surface of the thermal oxide film 5s is also oxidized, and the oxide film 11a is fused with the thermal oxide film 5s.

The third step (FIG. 5): a step of burying conductive materials in the first trench and the second trench.

A polysilicon layer is deposited on the entire surface. Then, with regard to the element region 21, a mask is provided just onto the upper portion of the guard ring 3. Regarding the surrounding region 22, a mask is provided onto a peripheral region of the first trench 7 on the surface of the substrate in a way that the polysilicon remains there. Hereafter, the entire surface is dry etched. The polysilicon layer may be a layer formed by depositing polysilicon that includes impurities. Or else, the polysilicon layer may be a layer formed by introducing impurities after depositing non-doped polysilicon. Through this process, a gate electrode 13b buried in the second trench 8 is formed, and polysilicon 13a is buried in the first trench 7 at the same time. The polysilicon 13a is formed in a way that part of the polysilicon 13a protrudes from the surface of the substrate and extends to cover the region area periphery of the trench. The first trench 7 in the surrounding region 22 constitutes an inversion prevention region 23 which contains an MIS (MOS) structure that is constructed of the oxide film 11a and the polysilicon 13a. What is buried in the first and second trenches 7 and 8 is not limited to polysilicon, and instead conductive materials such as metals may be buried in the trenches 7 and 8.

The fourth step (FIG. 6): a step of forming an element region by diffusing prescribed impurities in a periphery of the second trench.

First, a mask formed of a resist film (not illustrated) is formed, in a way that a portion to be a body region is exposed, for the purpose of stabilizing electric potential of the substrate. Then, boron is ion-implanted, for example, in a dose of $2.0 \times 10^{15}$ cm$^{-2}$ in a selective manner. Thence, by use of the mask, the oxide film 11b is removed from the body region in a way that the substrate corresponding to the body region is exposed. In this point, if a high concentration impurity region 20 is formed outside the inversion prevention region 23, the oxide film 11a is removed from the portion where the high concentration impurity region 20 is removed, too. Hereafter, the resist film is removed.

After a new resist film (not illustrated) is formed, arsenic is ion-implanted into an area to be a source region, for example, in a dose of approximately $5.0 \times 10^5$ cm$^{-2}$. Hereafter, by a thermal process, an n+ type source region 15 is formed, and a body region 14 is formed in a portion of the surface of the channel layer 4 adjacent to the source region 15. Then, the resist film is removed.

By this, an area periphery of the second trenches 8 constitutes a unit element (cell) of the MOSFET 25, and the element region 21 in which a plurality of MOSFETs are provided is formed.

The high concentration impurity region 20 may be formed by implanting arsenic into the surface of the substrate and diffusing the arsenic or the like on the surface of the substrate in the outer periphery of the inversion prevention region 23 in the same step where an ion implantation process is carried out for the forming of the source region 15. The high concentration impurity region 20 can contribute to improving properties of the ohmic contact between a sealed metal that connects with the inversion prevention region 23 and the substrate, and can also contribute to preventing an inversion.

With regard to conventional semiconductor devices, the area of the surrounding region 55 can not be reduced, since an annular layer 50 is formed at a sufficient distance away from the guard ring 33 for the purpose of securing breakdown voltage, and since the annular layer 50 is formed in a way that impurities are diffused fully in the horizontal direction by a phosphorous glass diffusion process for the purpose of preventing an inversion. According to the present embodiments, however, the area of the surrounding region 22 can be reduced to a large extent, since the region in which the annular layer 50 has been formed is large enough if the region has a width which is equal to the width of the inversion prevention region 23 which contains the MIS structure (i.e. the width of the polysilicon).

The high concentration impurity region 20 is formed for the purpose of enhancing an effect of preventing an inversion and for the purpose of improving properties of the ohmic contact between the sealed metal and the substrate, and this region operates as an annular layer. According to this embodiment, however, the width of the high concentration impurity region 20 may be small, since the inversion prevention region 23 is formed. In addition, since the high concentration impurity region 20 can be formed by an ion implantation process at the same time when the source region 15 of the MOSFET is formed by the ion implantation process, the diffusion in the horizontal direction can be suppressed, and additionally manufacturing steps can be simplified.

The fifth step (FIG. 7): a step of electrically connecting the conductive material which has been buried in the first trench and the substrate, and of forming a prescribed electrode which is in contact with the element region.

An NSG layer or a PSG (Phosphorus Silicate Glass) layer (not illustrated), and a BPSG (Boron Phosphorus Silicate Glass) layer 16 are deposited on the entire surface by a CVD process. Then, the top of the gate electrode 13b of the MOSFET is masked by a resist film. The element region 21 except for the MOSFET 25, the gate electrode 13c and the polysilicon 13a of the surrounding region 22 are etched while a mask is provided in a way that the element region 21 except for the MOSFET, the gate electrode 13c and the polysilicon 13a of the surrounding region 22 are exposed. Then, the interlayer insulating film 16 is formed.

Hereafter, aluminium or the like are deposited on the entire surface by use of a sputtering apparatus, and hereby the element region 21 and the entire surface of the surrounding region 22 are covered. The source electrode 17 which is in contact with the source region 15 and the body region 14 is formed. At the same time, the gate connection electrode 18 and the sealed metal 19 are formed (see FIG. 1B). The sealed metal 19 is in contact with the polysilicon 13a, and covers the inversion prevention region 23, and is extended in the high concentration impurity region 20 in a way that the sealed metal 19 is in contact with the high concentration impurity region 20. Since drain voltage is applied to the substrate, the drain voltage is also applied to the polysilicon 13a.

The embodiments of the present invention have been described citing an example of the n channel type MOSFET as mentioned above. The embodiments can be also realized by use of a MOS transistor whose conduction type is reversed.

In addition, the embodiments are not limited to use of the MOSFET. If an insulating gate semiconductor element such as an IGBT is used for the embodiments, the insulating gate semiconductor element can be formed at the same time when the inversion prevention region is formed, and can also achieve the same effect as the MOSFET brings about.

Furthermore the element region can be obtained by use of other discrete devices such as a bipolar transistor, a diode and a Schottky barrier diode. Elements of these kinds could contribute to enlarging the element region and reducing the area of the chip.

What is claimed is:

1. A semiconductor device, comprising:
an element region formed by diffusing prescribed impurities on a semiconductor substrate;
a surrounding region surrounding the element region;
a trench formed on the semiconductor substrate in the surrounding region;
an insulating film formed in the trench; and
a conductive material buried in the trench,
wherein the device is configured so that an electric potential which is applied to the substrate is also applied to the conductive material, and
a high concentration impurity region, which is in contact with the conductive material, is provided on a surface of the substrate in the surrounding region.

2. A semiconductor device, comprising:
an element region in which an insulating gate semiconductor element of a trench type is provided on a semiconductor substrate;
a surrounding region surrounding the element region;
a trench formed on the semiconductor substrate in the surrounding region;
an insulating film formed in the trench; and
a conductive material buried in the trench,
wherein the device is configured so that an electric potential which is applied to the substrate is also applied to the conductive material, and
a high concentration impurity region, which is in contact with the conductive material, is provided on a surface of the substrate in the surrounding region.

3. The semiconductor device according to claim 1 or 2, wherein the conductive material is polysilicon.

4. A semiconductor device, comprising:
a semiconductor substrate comprising a semiconductor layer formed thereon;
an element region comprising a plurality of insulating gate semiconductor elements of a trench type formed in the semiconductor layer and corresponding to an inner portion of the semiconductor substrate;
a surrounding region corresponding to a peripheral portion of the semiconductor substrate and surrounding the element region;
a trench formed in the surrounding region and filled with a conductive material, an insulating film covering an inner wall of the trench and the trench being configured so as not to operate as a transistor; and
a high concentration impurity region disposed on the substrate in the surrounding region so as to be in contact with the conductive material.

* * * * *